United States Patent [19]

Maluf

[11] Patent Number: 5,731,874
[45] Date of Patent: Mar. 24, 1998

[54] DISCRETE WAVELENGTH SPECTROMETER

[75] Inventor: Nadim L Maluf, Mountain View, Calif.

[73] Assignee: The Board of Trustees of the Leland Stanford Junior University, Palo Alto, Calif.

[21] Appl. No.: 709,605

[22] Filed: Sep. 9, 1996

Related U.S. Application Data

[63] Continuation of Ser. No. 377,202, Jan. 24, 1995, abandoned.

[51] Int. Cl.$^6$ ........................................... G01J 3/28
[52] U.S. Cl. ........................................ 356/326; 356/328
[58] Field of Search ................................ 356/326, 328

[56] References Cited

U.S. PATENT DOCUMENTS

| | | | |
|---|---|---|---|
| 4,822,998 | 4/1989 | Yokota et al. | 356/419 |
| 4,878,735 | 11/1989 | Vilums . | |
| 5,020,910 | 6/1991 | Dunn et al. | 356/328 |
| 5,037,201 | 8/1991 | Smith, III et al. | 356/328 |
| 5,050,990 | 9/1991 | Smith, III et al. | 356/405 |
| 5,050,992 | 9/1991 | Drummond et al. | 356/328 |
| 5,119,183 | 6/1992 | Weisfield et al. | 358/75 |
| 5,159,404 | 10/1992 | Bittner | 356/328 |
| 5,161,040 | 11/1992 | Yokoyama et al. | 359/19 |
| 5,178,636 | 1/1993 | Silberman | 359/565 |
| 5,210,400 | 5/1993 | Usami . | |
| 5,349,176 | 9/1994 | Czichy | 250/206.2 |

OTHER PUBLICATIONS

Rabiner and Gold, "Theory of Discrete–Time Linear Systems," *Theory and Application of Digital Signal Processing*, 1975, Prentice–Hall, Inc., pp. 9–12, 26–28. (no month available).

Rabiner and Gold, "Finite Word Length Effects in Digital Filters," *Theory and Application of Digital Signal Processing*, 1975, Prentice–Hall, Inc., pp. 296–297. (no month available).

Hecht and Zajac, *Optics*, 1979, Addison–Wesley Publishing Company, pp. 347, 411–414. (no month available).

(List continued on next page.)

*Primary Examiner*—Frank G. Font
*Assistant Examiner*—Jason D. Vierra-Eisenberg
*Attorney, Agent, or Firm*—Majestic, Parsons, Siebert & Hsue

[57] ABSTRACT

A diffraction grating, diffraction structure or Fresnel zone device is formed on a first substrate for diffracting light components of different wavelengths. An array of detectors is formed on a second substrate for detecting different wavelength components diffracted where the second substrate is spaced apart from the grating, structure or device to form a spectrometer. Spectrometers sensitive to the particular spectral lines may be used for detecting the presence of substances. The spectral resolution at such spectral lines may be increased relative to other regions to enhance the sensitivity of detection. This is done by inverse Fourier transform of the desired discrete spectrum to obtain a desired transmission function and by half-toning the aperture function.

9 Claims, 6 Drawing Sheets

OTHER PUBLICATIONS

Goldman, White and Anheier, "Miniaturized Spectrometer Employing Planar Waveguides and Grating Couplers for Chemical Analysis," *Applied Optics*, Nov. 1990, vol. 29, No. 31, pp. 4583–4589.

Soole, Schere, LeBlanc, Andreadakis, Bhat and Koza, "Spectrometer on a Chip: InP–based Integrated Grating Spectrograph for Wavelength Multiplexed Optical Processing," *Optical Technology for Signal Processing Systems*, Mar. 1991, SPIE vol. 1474, pp. 268–274.

Holm–Kennedy, Tsang, Sze, Jiang and Yang, "A Novel Monolithic, Chip–integrated, Color Spectrometer: The Distributed Wavelength Filter Component," *Current Developments in Optical Design and Optical Engineering*, Apr. 1991, SPIE vol. 1527, pp. 322–331.

Stephen, "A Comparison of Selected Digital Halftoning Techniques," *Microsystems*, Jun. 1991, vol. 15, No. 5, pp. 249–255.

Terasawa, Hasegawa, Fukuda and Katagiri, "Imaging Characteristics of Multi–Phase–Shifting and Halftone Phase–Shifting Masks," *Journal of Applied Physics*, Nov. 1991, No. 11B, pp. 2991–2997.

Kwa and Wolffenbuttel, "Integrated Grating/Detector Array Fabricated in Silicon Using Micromachining Techniques," *Sensors and Actuators*, 1992, A.31, pp. 259–266. (no month available).

Pati, Wang, Liang and Kailath, "Phase–Shifting Masks: Automated Design and Mask Requirements," *Optical/Laser Microlithography VII*, Jan. 1994, SPIE vol. 2197, pp. 314–327.

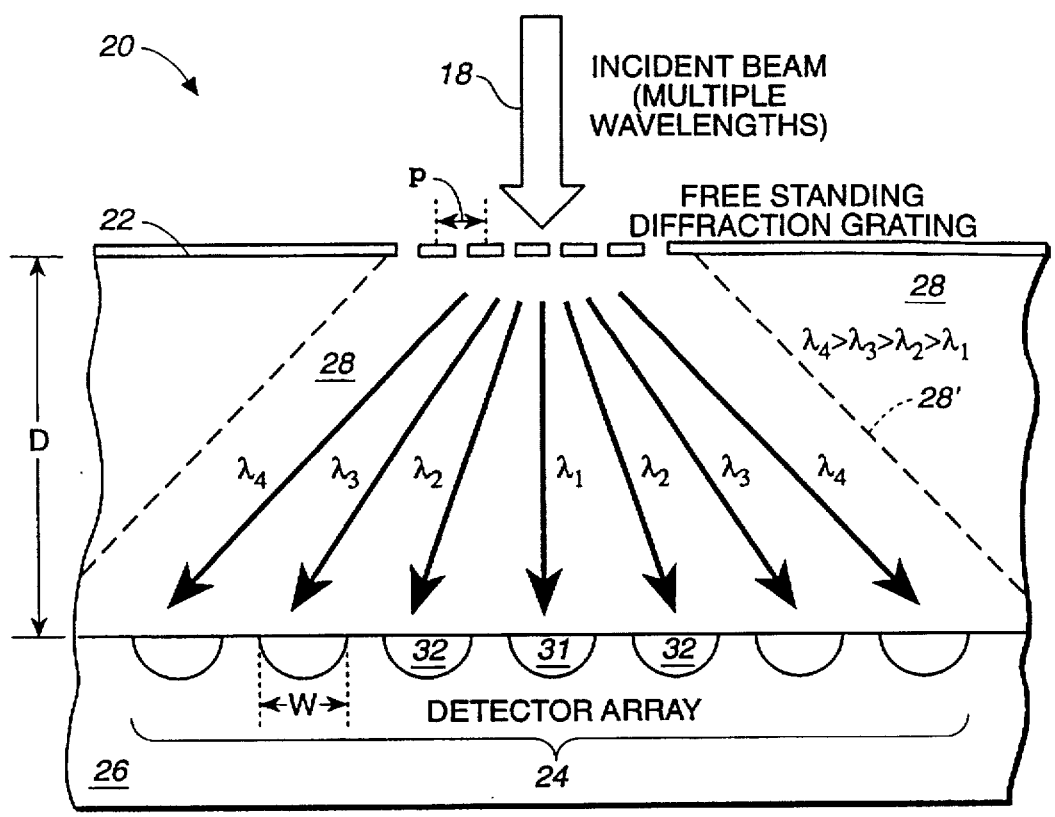
FIG._1
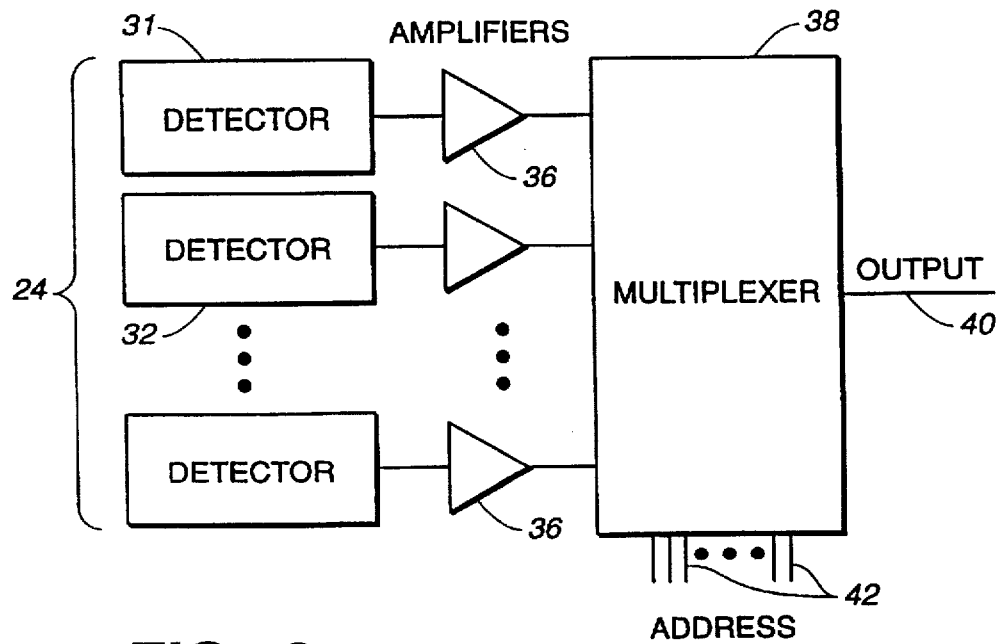
FIG._2

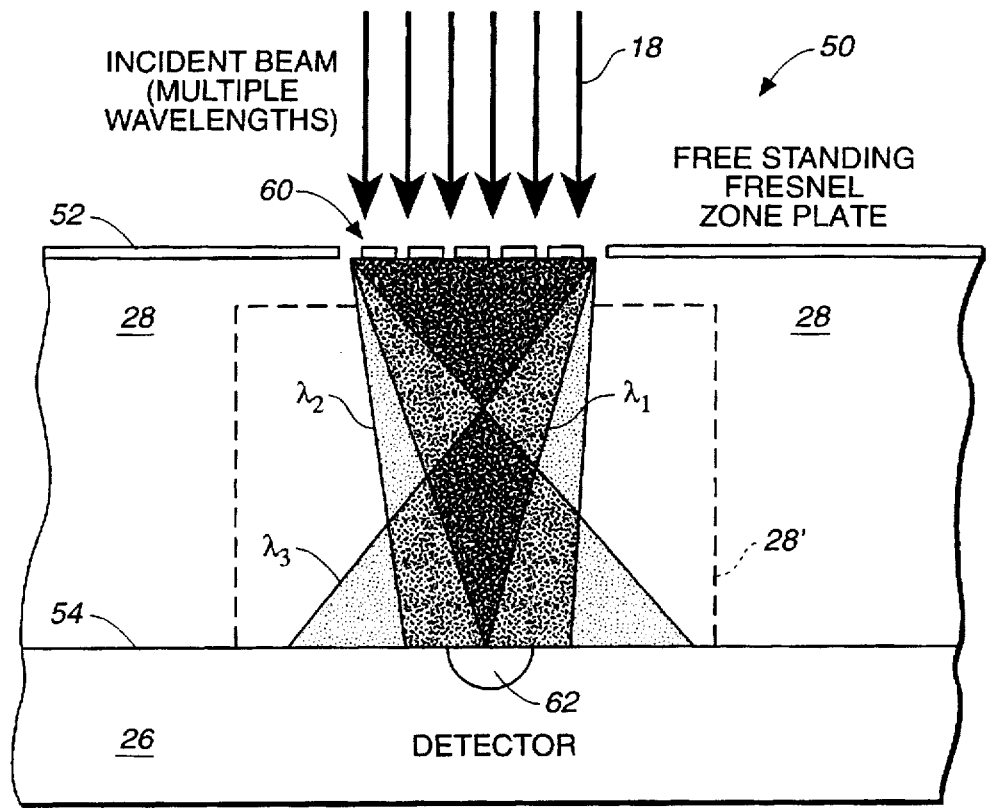
FIG._3
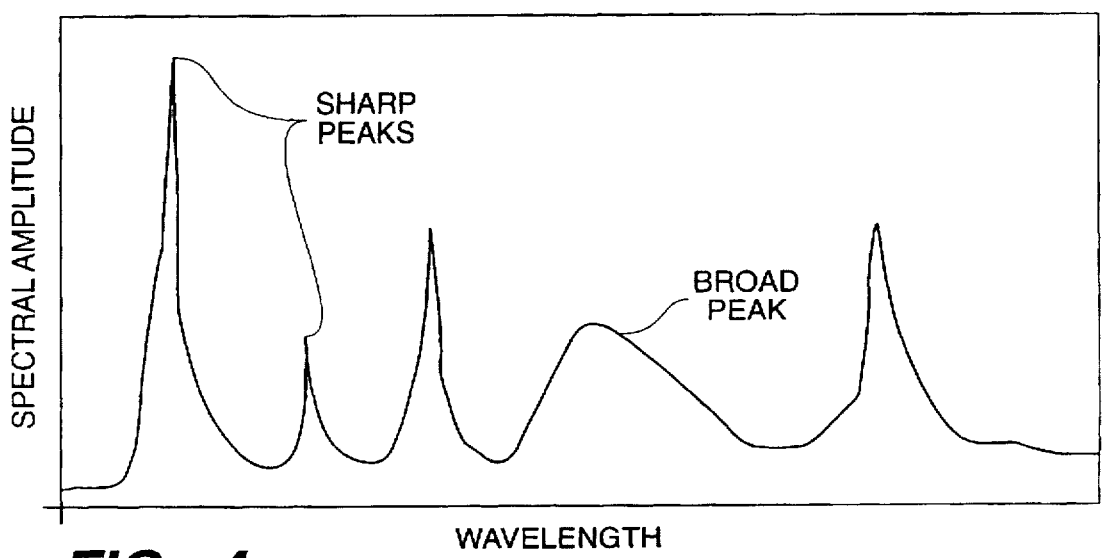
FIG._4

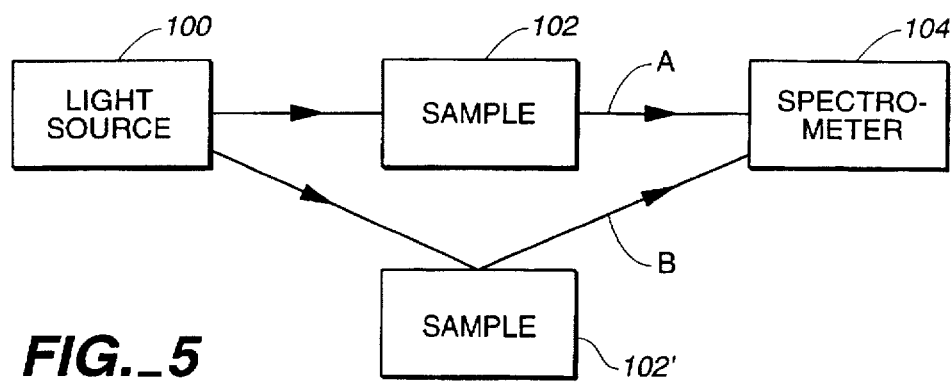
FIG._5
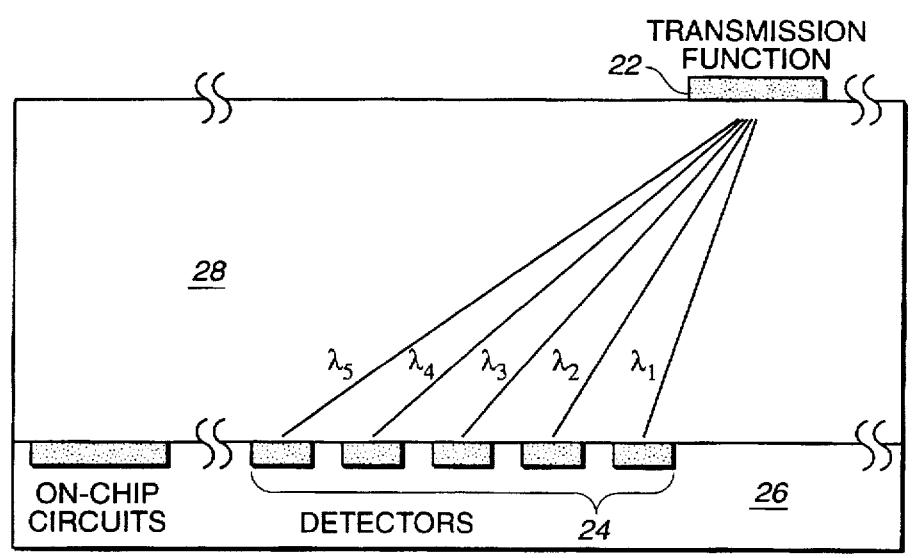
FIG._6A
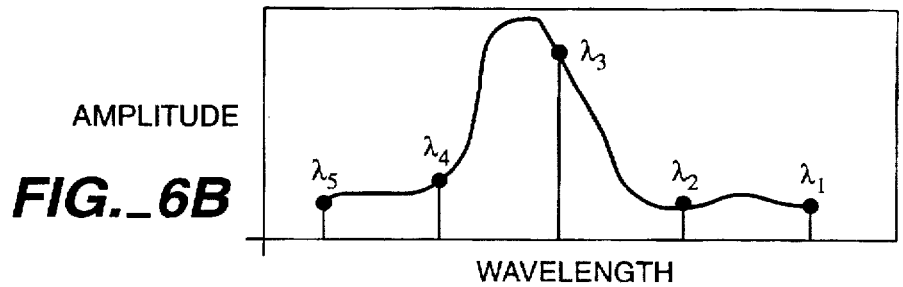
FIG._6B
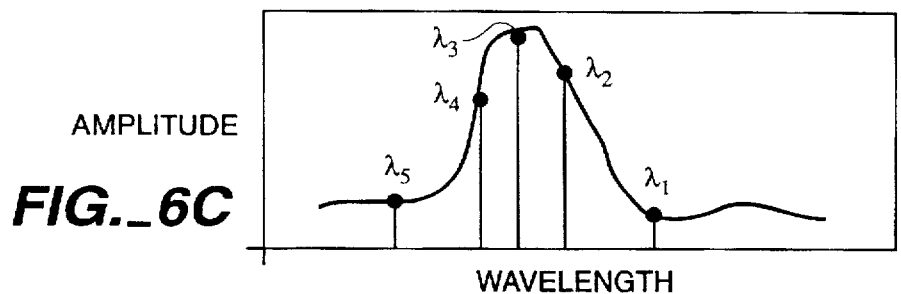
FIG._6C

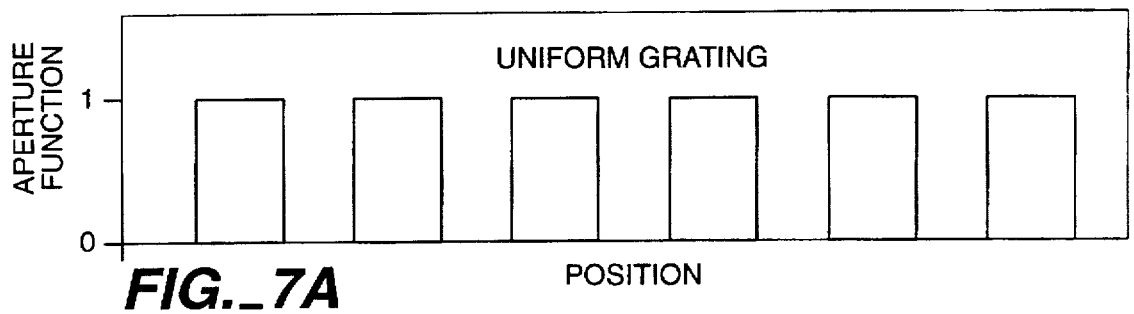
FIG._7A
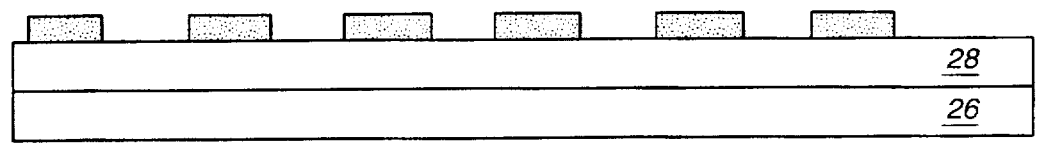
FIG._7B
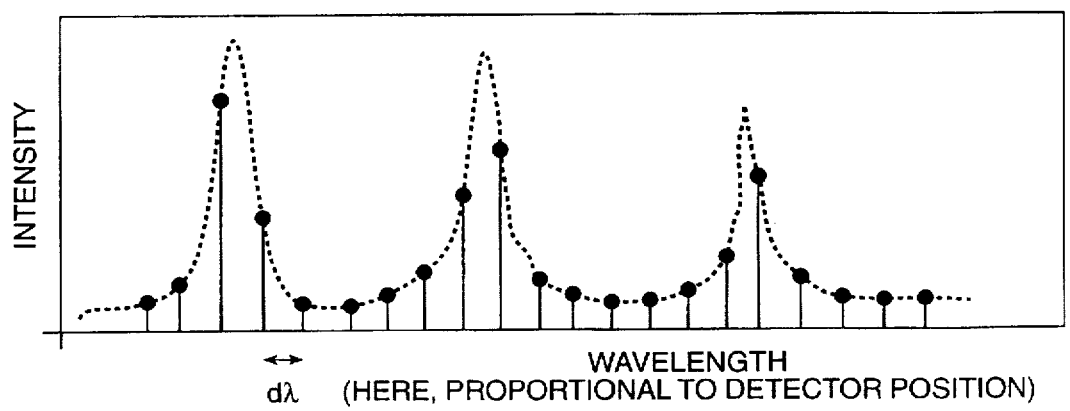
FIG._7C

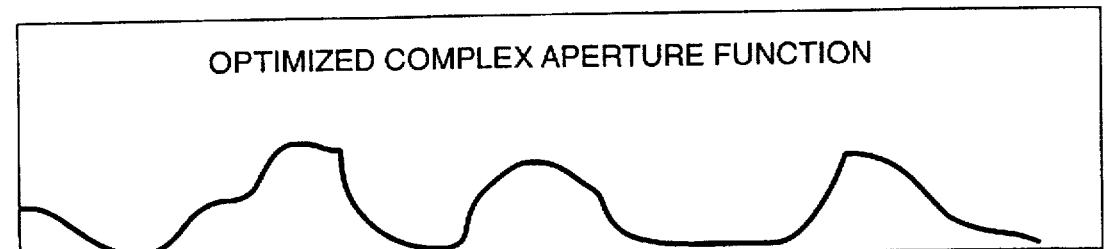
FIG._8A
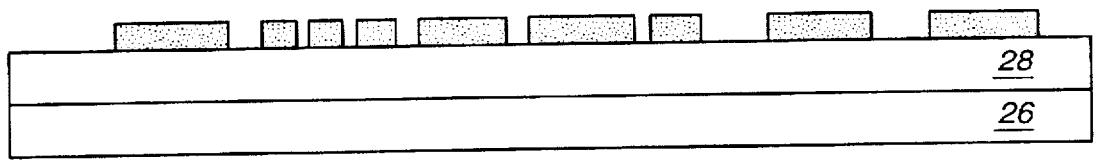
FIG._8B
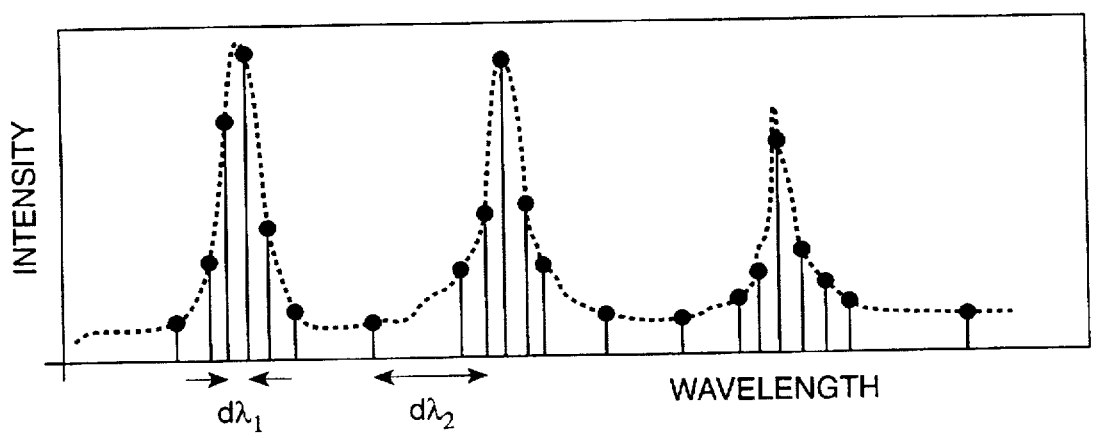
FIG._8C

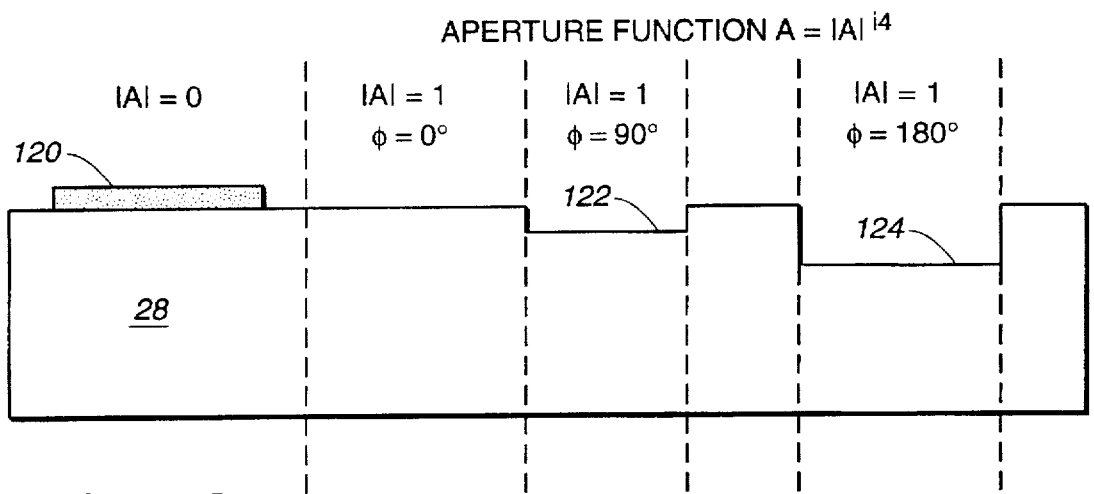
FIG._9A
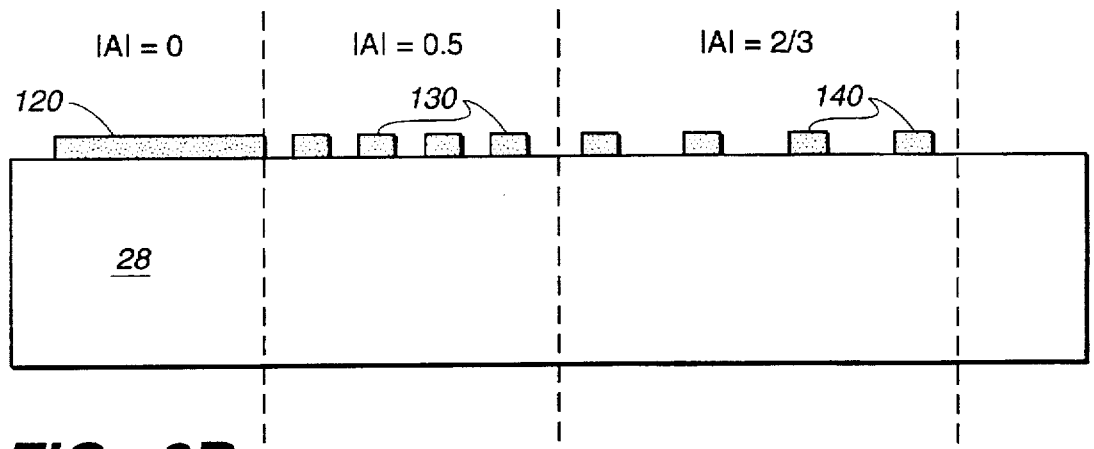
FIG._9B
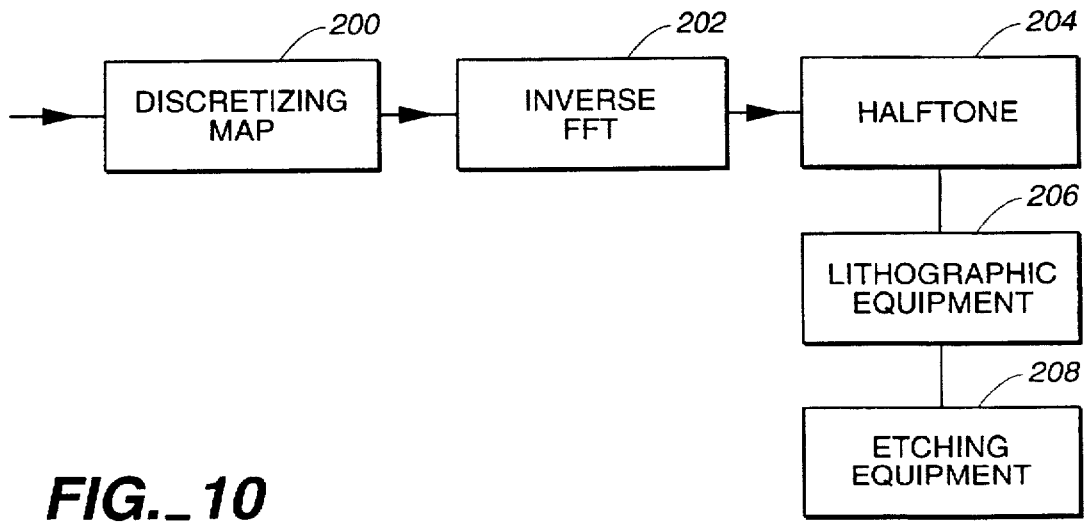
FIG._10

DISCRETE WAVELENGTH SPECTROMETER

This is a continuation of application Ser. No. 08/377,202, filed Jan. 24, 1995, now abandoned.

BACKGROUND OF THE INVENTION

This invention relates in general to spectrometers, and in particular, to a discrete wavelength spectrometer.

Conventional spectrometers operate by using a grating which diffracts the incident wideband light beam into a continuum of wavelengths. The higher the wavelength, the larger the angle of diffraction. By rotating the grating, the diffracted beam is scanned across a photodetector and the intensity at each wavelength is detected. Conventional spectrometers are large in size and expensive to build because of the many mechanical components necessary for the accurate beam scan.

There has been recently increased research activity directed towards developing spectrometers for sensing applications and for wavelength division multiplexing (WDM) in optical communication. However, a simple low-cost solution with an integrated detector still lacks. Goldman et al. proposed a planar wavelength with a diffraction grating that can be used for coupling light between a chemical medium and a detector array. See "Miniaturized Spectrometer Employing Waveguides and Grating Couplers for Chemical Analysis," by Goldman et al., *Applied Optics*, Vol. 29, No. 31, pp. 4583–4589, Nov. 1, 1990. However, the authors did not address integrating the detector with the waveguide. Holm-Kennedy et al. described a distributed wavelength filter based on a Fabry-Perot cavity with varying thickness. See "A Novel Monolithic, Chip-Integrated, Color Spectrometer: The Distributed Wavelength Filter Component," by Holm-Kennedy et al., *Current Developments in Optical Design and Optical Engineering*, SPIE Vol. 1527, pp. 322–331, 1991. Integration of the filter with a detector was, however, not discussed by the authors. Cremer et al. presented a system for WDM fabricated in InGaAsP/InGaAs/InP. See "Grating Spectrograph Integrated with Photodiode Array in InGaAsP/InGaAs/Inp," by Cremer et al, *IEEE Photonics Technology Letters*, Vol. 4, No. 1, pp. 108–110, 1992. The waveguides used to channel the light from a grating to a detector array limit the efficient use of the spectrometer to the infrared. Furthermore, the fabrication process is complex, resulting in increased manufacturing costs. A recently awarded patent to Dunn and Langley, U.S. Pat. No. 5,020,910, describes forming a diffraction grating directly over a photodetector. The grating acts as a light filter where only wavelengths shorter than the grating pitch are allowed through the grating and thus are detected. However, this device suffers from two shortcomings. First, the output of the detector measures the sum of the intensities at all wavelengths shorter than the grating pitch; electronic decomposition of the signal using external circuitry is necessary to obtain a useful spectrum of the incident illumination. Second, in order to obtain a spectral resolution that matches that of existing spectrometers, the required degree of accuracy on the grating pitch will have to be much smaller than the wavelength of the illumination. Such an accuracy cannot be achieved using existing lithographic tools. Yet another approach is proposed by Smith III et al. in U.S. Pat. No. 5,037,201, where a number of photodetectors are formed on a transparent substrate which resolves a polychromatic image by means of diffraction. Since the photodetectors are formed directly on the transparent substrate, the spectrometer proposed by Smith III et al. is much more limited in the choice of detectors and involves complex and costly fabrication processes.

None of the above-described approaches is entirely satisfactory. It is therefore desirable to provide an improved discrete wavelength spectrometer where the above-described difficulties are alleviated.

SUMMARY OF THE INVENTION

One aspect of the invention is directed towards a discrete wavelength spectrometer comprising a diffraction grating, a semiconductor first substrate spaced apart from the grating, and an array of detectors on the first substrate at such locations that each detector is located to detect light diffracted by the grating at a different predetermined diffraction angle corresponding to a particular sub-interval of wavelengths of the diffracted light.

Another aspect of the invention is directed towards a method for making a discrete wavelength spectrometer comprising the following steps. At least one diffraction grating, diffraction structure or Fresnel zone device is produced on a first substrate for diffracting light components of different sub-intervals of wavelength at different angles. An array of detectors is fabricated on a second substrate at such locations that each detector is located to detect light diffracted by the at least one diffraction grating, diffraction structure or Fresnel zone device and to detect a particular sub-interval of wavelengths of the diffracted light when the array is at a particular spacing from the diffraction grating, diffraction structure or Fresnel zone device. The position of the array is fixed so that the array is at said spacing to the diffraction grating, diffraction structure or Fresnel zone device.

Another aspect of the invention is directed towards a discrete wavelength spectrometer comprising a first member having a plurality of Fresnel zone devices thereon, each of said devices focusing light of a different sub-interval of wavelengths onto a focal region on a common image plane, and a second member having an array of detectors thereon, each of the detectors located substantially in said image plane and at a focal region of a corresponding Fresnel zone device.

Yet another aspect of the invention is directed towards an apparatus for detecting from a sample the presence of a substance having a characteristic optical spectrum, comprising means for generating light having components characteristic of the optical spectrum of the material in the sample, at least one diffraction structure for diffracting said components at predetermined diffraction angles, and a semiconductor first substrate spaced apart from the diffraction structure. The apparatus further includes an array of detectors on said first substrate. The diffraction structure and the detectors are such that each detector is located to detect one of the components in order to detect the presence of the substance.

One more aspect of the invention is directed towards a spectrometer comprising a diffraction structure for diffracting light components at different angles, wherein different diffraction angles are indicative of different sub-intervals of wavelength of diffraction components, wherein the transmission function of the diffraction structure is such that spectral resolution at at least one sub-interval of wavelength for a component is higher than the spectral resolution of some other sub-intervals. The spectrometer further includes an array of detectors to detect the components at said sub-intervals.

Yet another aspect of the invention is directed towards a method for making a discrete wavelength spectrometer for detecting a substance. The method comprises producing a diffraction structure for diffracting light, so that light components within different sub-intervals of wavelengths of a light spectrum that characterize said substance are directed at predetermined diffraction angles. The method further comprises fabricating an array of detectors on a substrate at selected locations to detect said light components at said predetermined diffraction angles, and fixing the position of the substrate and array relative to the diffraction structure.

BRIEF DESCRIPTION OF THE DRAWINGS

FIG. 1 is a cross-sectional view of a portion of a discrete wavelength spectrometer to illustrate one aspect of the invention.

FIG. 2 is a block diagram of electronic circuitry for use with the spectrometers of this application, such as that of FIG. 1.

FIG. 3 is a cross-sectional view of a portion of a discrete wavelength spectrometer using a Fresnel zone plate to illustrate another aspect of the invention.

FIG. 4 is the typical spectrum of a gas to illustrate how gases and other substances may be detected using the spectrometers of this application.

FIG. 5 is a block diagram illustrating how particular substances of samples may be detected using the spectrometers of this application.

FIG. 6A is a schematic diagram of a spectrometer to illustrate another aspect of the invention on re-allocation of spectral resolution.

FIG. 6B illustrates the spectral resolution of a spectrum obtained using a periodic grating.

FIG. 6C illustrates a spectrum obtained where an optimized transmission function is employed in lieu of a periodic grating in order to re-allocate spectral resolution.

FIG. 7A is a graphical illustration of the transmission function of the uniform grating.

FIG. 7B is a cross-sectional view of a spectrometer employing a uniform grating.

FIG. 7C is a spectrum obtained using the uniform grating of FIG. 7B which has the uniform transmission function of FIG. 7A.

FIG. 8A is a graphical illustration of an optimized complex transmission function used to optimize spectral resolution.

FIG. 8B is a cross-sectional view of a spectrometer having a transmission function that approximates that of FIG. 8A to improve spectral resolutions within certain sub-intervals of wavelengths.

FIG. 8C is a spectrum illustrating the increased spectral resolution near certain spectral lines of interest where the spectrometer of FIG. 8B is used.

FIG. 9A is a cross-sectional view of a transparent layer with a surface etched to different depths to illustrate a phase-shifting structure to approximate the phase term of a transmission function, so that use of structures in FIGS. 9A and 9B together would approximate both the amplitude and phase of an aperture function.

FIG. 9B is a cross-sectional view of a pattern having opaque and light-transmissive regions, where the area ratio of the light-transmissive or transparent regions to those of the opaque regions approximates the amplitude of a transmission function desirable to achieve the re-allocation of spectral resolution.

FIG. 10 is a block diagram of a system for making a spectrometer in which spectral resolution of certain selected sub-intervals of a spectrum have been increased relative to other portions of the spectrum.

For simplicity in description, identical components of this application are identified by the same numerals.

DETAILED DESCRIPTION OF THE PREFERRED EMBODIMENT

FIG. 1 is a cross-sectional view of a portion of a discrete wavelength spectrometer to illustrate one aspect of the invention. The spectrometer of FIG. 1 eliminates the need for moving objects by dividing the spectrum into a number of wavelength sub-intervals and dedicating a single detector for each of these subintervals. This effectively quantizes the continuum of the spectrum into useful wavelength bands whose widths depend on the number of available detectors. This quantization scheme is similar to the principle of operation of an electronic analog-to-digital converter. The structure of the spectrometer utilizes a single lithographically patterned diffraction grating separated from a detector array by a small distance such as 2 or 3 millimeters. As shown in FIG. 1, the incident light beam 18 is diffracted by a grating 22 which "breaks up" the beam into its components with wavelengths $\lambda_1$, $\lambda_2$, $\lambda_3$, $\lambda_4$. Each wavelength is diffracted at a specific angle dependent only on the wavelength itself and the pitch of the grating. The component of wavelength $\lambda_1$ passes through grating 22 to reach detector 31 of detector array 24. Component with wavelength $\lambda_2$ is diffracted by a small angle towards detectors 32, etc. As shown in FIG. 1, the components with larger wavelengths are diffracted at larger angles towards detectors that are further laterally displaced from the path of beam 18. By properly positioning a detector under the grating to match the corresponding diffraction angle of a particular wavelength component, the intensity of the beam at that particular wavelength is measured.

The spectral resolution of the spectrometer 20 is determined only by the angle subtended by the detector with respect to the incident light beam, enhanced by the width of the detector, W. Given a grating-to-detector spacing D and a grating pitch p, a first-order estimate of the spectral resolution $d\lambda$ is given by:

$$d\lambda \approx W*p/D$$

A device configuration capable of achieving a spectral resolution of 1 nm (comparable to that delivered by conventional spectrometers) would utilize a detector 5 microns wide, a 0.5 micron pitch diffraction grating at a grating-to-detector spacing of 2.5 millimeters. These design values are easily achievable using integrated circuit fabrication and micromachining techniques. Even though the above dimensions are preferred, a wider range of dimensions are possible. For example, the pitch of the diffraction grating may take on any value less than about 5 microns and the width of detectors may take on any value less than about 30 microns. The spacing D may take on values less than about 10 millimeters. All such possible values are within the scope of the invention.

As shown in FIG. 1, spectrometer 20 includes a diffraction grating 22, an array of detectors 24 on a substrate 26, where the detectors are located at such locations on the substrate that each detector is located to detect light diffracted by the grating at a different predetermined diffraction angle corresponding to a particular sub-interval of wavelengths of diffracted light. Substrate 26 is spaced apart from the grating 22 and need not be transparent. Since the array of detectors are fabricated on the substrate which does not need to be transparent, a wide variety of detectors is possible. Where substrate 26 includes a single crystal silicon material, conventional semiconductor manufacturing techniques may be employed, thereby greatly simplifying the manufacturing process of the spectrometer and reducing the overall cost.

In the preferred embodiments, spectrometer 20 includes a transparent second substrate 28 supporting the grating 22, where the second substrate is in contact with the first substrate 26, so that the spacing D between the detector array and the diffraction grating can be set by the thickness of the substrate layer 28.

Spectrometer 20 of FIG. 1 may be fabricated as follows. Grating 22 is first produced on substrate 28. The array 24 of detectors is then fabricated on substrate 26 to detect a particular sub-interval of wavelengths of the diffracted light when the array is at a particular spacing from the diffraction grating. Then the position of the array is fixed so that it is at said spacing to the grating. This can be done conveniently by anodically bonding the two substrates 26, 28 together. Alternatively, the two substrates may be bonded together by transparent optical glue. Both techniques are well known. Electrical connections to the detector array may be made by bonding wires to bond pads on the silicon substrate 26 or by patterns of conductive traces on the surface of or in substrate 26.

The array 24 of detectors can be of any type such as IR detector, pin diode, charge couple device, etc. Preferably, the sub-detectors are small enough in area to fit an array of such detectors under the grating.

As an alternative method of fabrication, the detector array 24 is first fabricated on substrate 26 and a fixed sacrificial layer is then deposited on or bonded to substrate 26 and the diffraction grating 22 is patterned on top of the sacrificial layer. The sacrificial layer is then removed at the end to result in a free-standing diffraction grating over the detector array where the grating is held together by a frame 28' as shown in dotted line in FIG. 1.

Substrate 28 may be made of a transparent material such as glass or quartz. If substrate 28 is not transparent, then portions of substrate 28 along the paths of the light beams of components $\lambda_1, \lambda_2, \ldots$, are removed by processes such as etching to permit the diffracted components of beam 18 to pass from the grating 22 to the array 24 of detectors. This step is performed before the two substrates 26 and 28 are attached together.

FIG. 2 is a block diagram of a circuit for use with spectrometers such as that of FIG. 1 to provide an output. As shown in FIG. 2, the output of each of the detectors in array 24 is amplified by an amplifier 36 and the amplified output provided to a multiplexer 38. One of the amplified outputs is selected as the output 40 of the multiplexer in accordance with an address provided to the multiplexer along input 42.

FIG. 3 is a cross-sectional view of a discrete wavelength spectrometer using a Fresnel zone plate to illustrate another aspect of the invention. Fresnel zone plates are described, for example, by Hecht et al. on pages 375–376 of *Optics*, Addison-Wesley Publishing Company Reading, Mass. 1979. Spectrometer 50 of FIG. 3 includes a substrate 28 or a frame 28' supporting a first member having a plurality of Fresnel zone devices thereon, such as a plurality of Fresnel zone plates or Fresnel zone lenses 60. Each of the Fresnel zone plates or lenses focuses light of different sub-interval of wavelengths onto a focal region onto an image plane 54. The section of the spectrometer 50 shown in FIG. 3 illustrates only one of the Fresnel zone devices and only one detector, it being understood that other sections of the spectrometer 50 would include at least one other Fresnel device and detector arrangement similar to that shown in FIG. 3. As known to those skilled in the art, the Fresnel zone plate or lens will focus different wavelength components of beam 18 to different depths as illustrated in FIG. 3. Thus, components with longer wavelengths such as wavelength $\lambda_3$ will be diffracted at sharper angles and therefore be focused at shallower depths compared to other wavelength components such as $\lambda_1$, or $\lambda_2$. As shown in FIG. 3, the Fresnel zone plate 60 in the member 52 is of such design and pattern that it focuses components of wavelength $\lambda_1$ of beam 18 onto the image plane 54. Detector 62 is located in the focal region of device 60 to receive and detect the $\lambda_1$ components. Since other wavelength components are not focused onto detector 62, they may have negligible effect on the detector. While detectors of array 24 of FIG. 1 are in the shape of elongated strips, detector 62 may have circular or other shapes that are not elongated. Spectrometer 50 includes at least one more Fresnel zone device such as a Fresnel zone plate or lens that is patterned to focus components of a different wavelength, such as $\lambda_2$ or $\lambda_3$, onto image plane 54 where another detector similar to detector 62 will be located to receive and detect such components. With such patterns of Fresnel zone devices, it is then possible to locate all the detectors for detecting different wavelength components on a common image plane 54.

Spectrometer 50 can therefore be used to detect different wavelength components within certain selected sub-intervals of a spectrum by selecting those Fresnel zone devices that will focus wavelength components within such selected sub-intervals onto common image plane 54. While in the preferred embodiment image plane 54 is parallel to the plane of member 52, it will be understood that this is not necessary; such and all other variations are within the scope of the invention. The process for fabricating spectrometer 50 is similar to that of spectrometer 20 described above.

The spectrometers of this application described above may be used advantageously to detect the presence of particular substances, especially where the substance has distinct and specific spectral lines. FIG. 4 illustrates the typical spectrum of a gas. As shown in FIG. 4, it is evident that the typical spectrum of a gas exhibits several sharp peaks, so that if high intensity components of wavelengths corresponding to such sharp peaks of the gas spectrum are detected from light generated from or emitted by a substance, the presence of the gas in such substance is detected. For example, the spectral lines of hydrogen are at 656.2 nm, 486.1 nm, 479.7 nm, 410.1 nm etc. The detection of substances can be extended to beyond the emission spectrum of substances to the spectrum of light transmitted through (a reverse form of absorption spectrum) or reflected by substances as well.

FIG. 5 is a schematic view of a system using the spectrometer of this application for detecting substances in samples to illustrate the preferred embodiment of the invention. As shown in FIG. 5, light containing all the wavelength components characteristic of the optical spectrum of a substance (such as white light) and generated by a light source 100 is passed through a sample 102 as beam A to a spectrometer 104. If the light from source 100 stimulates light emission from sample 102, then the light emitted by sample 102 is supplied to spectrometer 104 for detection of the substance. Alternatively, if the substance in sample 102 is distinguished by the light absorbed by it, then the light transmitted through sample 102 originating from source 100 is sent to spectrometer 104 for detection. In either case, spectrometer 104 is constructed for detecting particular substances by selecting either a grating 22 or Fresnel zone devices 52 designed to detect wavelength components within certain selected sub-intervals of the spectrum that characterize the substance. Then the detection of high intensity wavelength components in those sub-intervals would indicate the presence of the substance. Where the substance in the sample is characterized by light reflected by it, an alternative to the above-described system is to detect the reflected light beam B from sample 102' instead of beam A and the sub-intervals of detection for spectrometer 104 would then be selected as a characteristic of the reflection spectrum of the sample 102'. A similar scheme may be used for substance detection by detecting refracted light.

Re-Allocation of Spectral Resolution

The separation of the incident illumination into its wavelength components can be also understood using basic Fourier optics. In its simplest form, given a transmission function T, where T=1 is for total transmission (transparent) and T=0 is for total opacity, the far field diffraction pattern (also known as Fraunhofer diffraction) at the image plane is proportional to the Fourier transform of T. For the simple case of an ideal grating which is an infinite square periodic transmission function, its Fourier transform is a sequence of impulses (or delta functions) uniformly separated with the separation set by the periodicity of the grating and the wavelength of the illuminating light. For single wavelength illumination, the grating generates diffraction orders located at each of the impulses described above. The first is called 1st order, the second 2nd order, . . . , etc. When white light is used, each wavelength component has its own set of diffraction orders separated from other wavelength components by the ratio of the wavelengths (for a given grating periodicity). Only the 1st order is of interest to us in this device. The overall spectral resolution using the grating is uniform at all wavelengths and is set by the number of detectors in the detector array, the grating pitch and the separation between the diffraction structure 22 and the detector array 24.

FIG. 6A is a spectrometer having a transmission function useful for illustrating the concept of re-allocation of spectral resolution. Where the transmission function is a periodic grating, the wavelengths are uniformly spaced with a separation determined by the pitch (periodicity) of the periodic grating. The separation determines the spectral resolution of the device according to the formula referenced above for dλ. FIG. 6B illustrates a spectrum obtained using a periodic grating. As shown in FIG. 6B, at the peak of the spectrum near wavelength $\lambda_3$, there is only one detection point by one detector for detecting the peak, whereas the remaining five detection points by five detectors detect wavelengths that are away from the spectral line indicated by the peak.

In some particular applications, a uniform spectral resolution is not of interest. Rather, it is desirable to expand the spectral resolution in some areas and compress it in others. This is particularly the case in the detection of gases or chemicals which have spectral lines as specific wavelengths in the spectrum and little energy in between. In such event, it will be desirable to expand the spectral resolution in the neighborhood of the spectral lines of the gas or chemical and compress it in the remaining areas. In the context of FIG. 6B, for example, it will be desirable to increase the spectral resolution and the number of points of detection at and close to the peak and reduce the number of points of detection away from the peak. Such desirable transmission function is illustrated in FIG. 6C. As shown in FIG. 6C, the optimized transmission function permits three detection points at and close to the peak and only two detection points away from the peak. The overall number of detectors remains unchanged.

It is of course possible to increase the density of detection points by increasing the density of detectors on the image plane where the diffracted wavelength components at the spectral lines of interest would strike and decrease the density of detectors at other areas. From the manufacturing point of view, instead of increasing detector density at certain locations on a substrate, it is much easier and less expensive to manufacture detector arrays that are uniformly spaced but where the diffraction angles of the wavelength components at the spectral lines of interest resulting from the transmission function are changed to redistribute such components to where the detectors are in order to increase detection points at the wavelengths of interest. This is equivalent to steering particular wavelengths to preset detector locations. The problem posed is therefore to find a transmission function in order to obtain the required spectral resolution at the image plane where the detectors are uniformly spaced in the image plane.

The above described problem is known as the inverse problem and its solution lies in a sequence of computational steps described next. First, the desired diffracted field distribution, that is the distribution of the diffracted wavelength components across the image plane is defined by the user. That includes defining the wavelength sub-intervals where the resolution is higher than that in other sub-intervals. Next, an aperture function is computed from the desired diffracted field distribution. This is done by performing an inverse Fourier transform on the desired diffracted field distribution as clearly described by Hecht et al. on pages 347, 411–414 of *Optics*, Addison-Wesley Publishing Company Reading, Mass. 1979. The resulting aperture function will be a complex function, that is, it will have a magnitude and a phase.

FIG. 7A is the graphical illustration of an aperture function of a uniform grating. FIG. 7B illustrates a spectrometer having a uniform grating and FIG. 7C illustrates the diffraction spectrum of the spectrometer of FIG. 7B. As explained above in referenced to FIG. 6B, again the detection points in FIG. 7C for uniform grating are not concentrated at the spectral lines of interest but are distributed uniformly across the spectrum and the spectral resolution is uniform across the spectrum and is approximately equal to the spectrum range divided by the number of detectors.

FIG. 8A illustrates an optimized complex aperture function for increasing the spectral resolution at the spectral lines of interest and relative to the spectral resolution at other areas of the spectrum. FIG. 8B is a cross-sectional view of a spectrometer having the aperture function of FIG. 8A and FIG. 8C illustrates the diffraction spectrum of the spectrometer of FIG. 8B with re-allocated spectral resolution at the spectral lines of interest. As shown in FIG. 8C, the spectral resolution $d\lambda_1$ near the spectral lines of interest is finer than $d\lambda_2$, the spectral resolution in the regions outside of the spectral lines. Even though the total number of detectors illustrates in FIGS. 7C, 8C are the same, more detectors are allocated for the spectral lines of interest in FIG. 8C than in FIG. 7C.

As a practical matter, it may be necessary to find a physical implementation of the complex aperture function A shown in FIG. 8A rather than the continuous function shown in the figure. This is illustrated in FIGS. 9A, 9B. A will have a magnitude and a phase term. The aperture function A obtained using the above-described inverse Fourier transform process will almost always be a complex solution. In half-toning, the magnitude can only be set to 0 (opaque) or 1 (transparent) in most manufacturing processes. The phase can be adjusted by angles between 0° and 180° easily; to adjust the phase by 180°, the transparent substrate is etched by half of the wavelength. Similarly, a 90° phase shift may be implemented by etching this transparent substrate by one-quarter of the wavelength and so on for other different degrees of phase shift. As a practical matter, however, it may be adequate to implement only the 0°, 90° and 180° phase shift, thereby etching the transparent substrate by half and one-quarter of the wavelength of the component of the light involved in a process known as dithering.

The dithering or half-toning process is illustrated in FIG. 9A. Thus, at locations where the aperture function A has the magnitude 0, the transparent substrate 28 is covered by an opaque layer 120. Where the magnitude of the aperture function A is a 1 such as at regions 122, 124, transparent substrate 28 is not covered by the opaque layer at all to allow light transmission therethrough. Region 122 of transparent substrate has been etched downwards by a distance equal to one-quarter of the wavelength and region 124 has been etched downwards by a distance of half of the wavelength of the component of interest, illustrating how the phase of the light passing through can be altered by a transmission function that approximates the phase term of an aperture function.

FIG. 9B illustrates a diffraction structure having a transmission function whose amplitude approximates that of the aperture function A desired, using half-toning, a process well-known to those in the printing art. Thus, where the amplitude of the aperture function is 0, the transparent substrate 28 is covered entirely by an opaque layer 120. Where the amplitude of the aperture function is a half, the opaque pixel dots of opaque layer 130 in such area would occupy and cover only half of the surface area of the transparent layer in such region. Where the amplitude of the aperture function is two-thirds, then the dots of opaque layer 140 covers only one-third of the total surface area of the transparent layer in this region and so on. Individual opaque dot pixels are much smaller in size compared to the total area that is being dithered. The amplitude of the transmission function resulting from the half-toning process is given by the ratio of the area of the transparent region to the area of the opaque region.

FIG. 10 is a block diagram of a system for making a spectrometer with a desired-re-allocated spectral resolution. First, the desired field distribution in the image plane is discretized by a discretizing map 200. This map can be implemented simply by setting to zero the amplitudes of the field in regions with no measurements of interest. An inverse fast Fourier transform process is then performed in block 202 to obtain the aperture function which as discussed above is usually a complex function having an amplitude term and a phase term. The half-toning process is performed in block 204 on the complex aperture function in the manner explained above in reference to FIGS. 9A, 9B and the transmission function resulting from the half-toning process is applied to lithographic equipment 206 for making masks. One mask is necessary for determining which areas of an opaque layer on top of a transparent layer should be etched away to allow light transmission therethrough; such mask is derived from the amplitude of the transmission function. One would first start out with a transparent substrate having an opaque layer on top attached thereto. The transparent substrate underneath is exposed in areas where portions of the opaque layer have been etched away as determined by the mask which is a digital approximation of the amplitude of the aperture function. Then the mask for etching the transparent substrate by one-quarter of the wavelength is applied and the transparent substrate etched to such depth.

Then the mask for etching the transparent substrate to half of the wavelength is applied and the substrate so etched.

The algorithm and the approximating imaging system model for the above-described phase shifting masks are described in detail in the article, "Phase-Shifting Masks: Automated Design and Mask Requirements," by Pati et al., *Proceedings*, SPIE Vol. 2197, pp. 314–327, March 1994. Multi-phase-shifting and half-tone phase-shifting masks actually made are described in the article, "Imaging Characteristics of Multi-Phase-Shifting and Halftone Phase-Shifting Masks," by Terasawa et al., pp. 2991–2997, November 1991.

While the invention has been described above by reference to various embodiments, it will be understood that different changes and modifications may be made without departing from the scope of the invention which is to be limited only by the claims.

What is claimed is:

1. A discrete wavelength spectrometer comprising:

a diffraction grating having a substantially constant pitch for diffracting light at different diffraction angles relative to the grating;

a semiconductor first substrate spaced apart from the grating and not in contact with the grating; and an array of detectors on or in a first surface of said substrate at such locations that each detector is located to detect light diffracted by the grating at a different predetermined diffraction angle corresponding to a particular sub-interval of wavelengths of the diffracted light.

2. The spectrometer of claim 1, wherein said substrate includes a single crystal silicon material.

3. The spectrometer of claim 1, further comprising a transparent second substrate supporting said grating, said second substrate being in contact with the first substrate, so that spacing between the detector array and the diffraction grating can be set by the thickness of the second substrate.

4. The spectrometer of claim 1, wherein said detectors are in the shape of elongated strips with widths less than 30 microns.

5. The spectrometer of claim 1, wherein the pitch of the diffraction grating is less than 5 microns.

6. The spectrometer of claim 1, wherein the grating and the first substrate are spaced apart by less than 10 mm.

7. A discrete wavelength spectrometer comprising:

a first member;

a plurality of Fresnel zone devices on the first member, each of said devices focusing light of a different sub-interval of wavelengths onto a focal region on a common image plane; and a semiconductor second member having an array of detectors on or in a first surface of the second member, each of the detectors located substantially in said image plane and at a focal region of a corresponding Fresnel zone device, said second member being spaced apart from and not in contact with the devices and said array being located so that the first member separates said array from the Fresnel zone devices.

8. The spectrometer of claim 7, said first member including a transparent layer and an opaque layer forming said devices.

9. The spectrometer of claim 7, wherein said second member includes single crystal silicon material.

* * * * *